United States Patent
Inao (10) Patent No.: US 9,281,225 B2
(45) Date of Patent: Mar. 8, 2016

(54) SUBSTRATE PROCESSING APPARATUS AND SUBSTRATE PROCESSING METHOD

(71) Applicant: Tokyo Ohka Kogyo Co., Ltd., Kawasaki-shi (JP)

(72) Inventor: Yoshihiro Inao, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 406 days.

(21) Appl. No.: 13/670,159

(22) Filed: Nov. 6, 2012

(65) Prior Publication Data

US 2013/0113147 A1 May 9, 2013

(30) Foreign Application Priority Data

Nov. 8, 2011 (JP) ................... 2011-244832

(51) Int. Cl.
| | |
|---|---|
| *H01L 21/677* | (2006.01) |
| *H01L 21/687* | (2006.01) |
| H01L 21/683 | (2006.01) |
| H01L 21/67 | (2006.01) |

(52) U.S. Cl.
CPC .... *H01L 21/67742* (2013.01); *H01L 21/67766* (2013.01); *H01L 21/68707* (2013.01); *H01L 21/67092* (2013.01); *H01L 21/6838* (2013.01); *Y10T 156/10* (2015.01)

(58) Field of Classification Search
CPC ............ H01L 21/67766; H01L 21/68707; H01L 21/67742; H01L 21/67092; H01L 21/6838
USPC ............ 269/55, 21; 156/60, 382, 345.31, 156/345.32, 581; 118/719, 715
See application file for complete search history.

(56) References Cited

U.S. PATENT DOCUMENTS

| | | | | |
|---|---|---|---|---|
| 6,156,125 | A * | 12/2000 | Harada | H01L 21/67126 118/50 |
| 2001/0043989 | A1* | 11/2001 | Akimoto et al. | 427/299 |
| 2002/0001920 | A1* | 1/2002 | Takisawa | H01L 21/6838 438/455 |
| 2002/0182038 | A1* | 12/2002 | Takisawa | H01L 21/67092 414/271 |
| 2003/0054668 | A1* | 3/2003 | Kitano | H01L 21/67034 438/782 |
| 2004/0016637 | A1* | 1/2004 | Yang | H01L 21/67028 204/242 |
| 2007/0125495 | A1* | 6/2007 | Nakamura | H01L 21/68742 156/382 |
| 2010/0200962 | A1 | 8/2010 | Kihara | |
| 2011/0311339 | A1* | 12/2011 | Yasui | H01L 21/67196 414/217 |
| 2012/0132359 | A1 | 5/2012 | Nakamura et al. | |

FOREIGN PATENT DOCUMENTS

| | | |
|---|---|---|
| JP | 2004-079637 | 3/2004 |
| JP | 2007-158122 | 6/2007 |

(Continued)

OTHER PUBLICATIONS

Office Action in Japanese Patent Application No. 2011-244832, mailed May 19, 2015.

*Primary Examiner* — Lee D Wilson
*Assistant Examiner* — Seahee Yoon
(74) *Attorney, Agent, or Firm* — Knobbe Martens Olson & Bear LLP (57) ABSTRACT

A substrate processing apparatus including a transfer unit for transferring, under reduced pressure, a laminate including a wafer and a support plate which are bonded to each other and supported by use of support pins that supports an inner periphery of a first surface of the wafer, the first surface being opposite to a second surface of the wafer onto which a second surface the support plate is bonded.

5 Claims, 6 Drawing Sheets

(56) References Cited

FOREIGN PATENT DOCUMENTS

| | | |
|---|---|---|
| JP | 2008-041760 | 2/2008 |
| JP | 2008-098589 A | 4/2008 |
| JP | 2009-283537 | 12/2009 |
| JP | 2010-272743 | 12/2010 |
| JP | 2012-182278 | 9/2012 |

* cited by examiner

SUBSTRATE PROCESSING APPARATUS AND SUBSTRATE PROCESSING METHOD

This application claims priority under 35 U.S.C. §119(a)-(d) to Japanese Patent Application No. 2011-244832, filed on Nov. 8, 2011, the entire contents of which are incorporated herein by reference.

TECHNICAL FIELD

The present invention relates to a substrate processing apparatus and a substrate processing method.

BACKGROUND ART

Patent Literature 1 describes (i) a method for supporting a wafer at more than one point in an outer periphery of the wafer in thermal treatment, and (ii) a jig for supporting the wafer at more than one point in the outer periphery of the wafer in thermal treatment.

CITATION LIST

Patent Literature

Patent Literature 1
Japanese Patent Application Publication, Tokukai No. 2008-98589 A (Publication Date: Apr. 24, 2008)

SUMMARY OF INVENTION

Technical Problem

Recently, in response to enhancement of functions of apparatuses such as mobile phones, digital AV equipment, and IC cards, there have been increasing requests for reduced size and thickness and a higher integration of semiconductor silicon chips to be mounted on such apparatuses. In order to satisfy such requests for reduced size and thickness of the semiconductor silicon chips, it is required to thin wafers by grinding.

A thinned wafer tends to warp, while being transferred, stored, etc. in production. A method described in Patent Literature 1 cannot suitably prevent a wafer from warping because the method does not consider prevention of such warping of a wafer. Therefore, there have been demands for a substrate processing apparatus and a substrate processing method each of which makes it possible to prevent a wafer from warping during production.

The present invention was made in view of the problem, and an object of the present invention is to provide a substrate processing apparatus and a substrate processing method each of which makes it possible to prevent a wafer from warping during production.

Solution to Problem

A substrate processing apparatus of the present invention, including: a support jig including support sections and supporting, by use of the support sections, a wafer to which a support is bonded, the support sections supporting an inner periphery of a first surface of the wafer, the first surface being opposite to a second surface of the wafer onto which second surface the support is bonded; and transfer means for transferring the wafer supported by the support jig under reduced pressure.

A substrate processing method of the present invention including the steps of: supporting a wafer to which a support is bonded, by supporting an inner periphery of a first surface of the wafer, the first surface being opposite to a second surface of the wafer onto which second surface the support is bonded; and transferring the wafer thus supported under reduced pressure.

Advantageous Effects of Invention

A substrate processing apparatus and a substrate processing method of the present invention, including: a support jig including support sections and supporting, by use of the support sections, a wafer to which a support is bonded, the support sections supporting an inner periphery of a first surface of the wafer, the first surface being opposite to a second surface of the wafer onto which second surface the support is bonded; and transfer means for transferring the wafer supported by the support jig under reduced pressure. It is therefore possible to prevent the wafer from warping during production.

Figure 1:
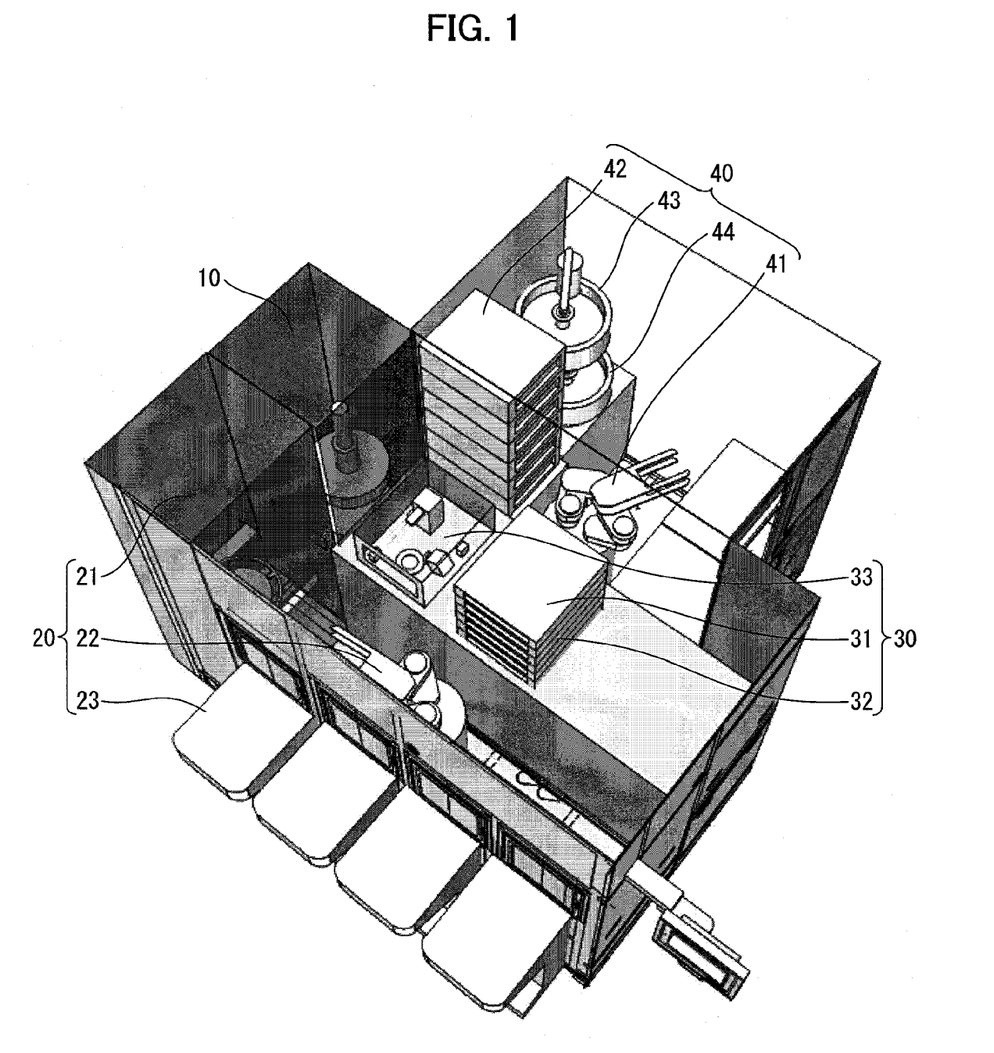
FIG. 1 is a top perspective view schematically showing a substrate processing apparatus in accordance with an embodiment of the present invention.
Figure 2:
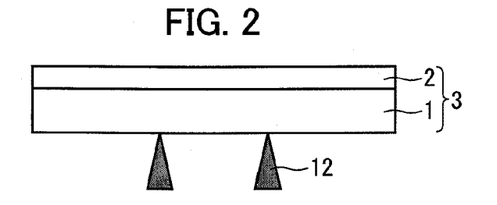
FIG. 2 is a cross-sectional view schematically showing an example of positions at which a laminate is supported in a substrate processing apparatus in accordance with an embodiment of the present invention.

DETAILED DESCRIPTION OF THE EMBODIMENTS (Substrate Processing Apparatus 100)
The following describes an embodiment of the present invention with reference to FIGS. 1 and 2. FIG. 1 is a top perspective view schematically showing a substrate processing apparatus in accordance with an embodiment of the present invention. FIG. 2 is a cross-sectional view schematically showing an example of positions supporting a laminate in a substrate processing apparatus in accordance with an embodiment of the present invention. As shown in FIGS. 1 and 2, the substrate processing apparatus 100 includes a transfer unit (transfer means) 20 for transferring a laminate 3 that is formed by bonding a wafer 1 and a support plate (support) 2. While the laminate 3 is transferred in the transfer unit 20, a wafer 1 side of the laminate 3 is supported by use of support pins (support sections) 12.

The substrate processing apparatus 100 may further include a bonding unit 10, a cooling unit 30, and an applying unit 40. In the substrate processing apparatus 100, first, a wafer 1 and a support plate 2 are aligned in the cooling unit 30. Next, an adhesive is applied to the wafer 1 or the support plate 2, and then baked in the applying unit 40. Thereafter, the wafer 1 and the support plate 2 are transferred to the bonding unit 10, and bonded to each other under pressure so as to form the laminate 3. The laminate 3 is then transferred back to the cooling unit 30 by the transfer unit 20. In the cooling unit 30, the laminated 3 is held and cooled.

In the substrate processing apparatus 100, processing is carried out on the wafer 1 to which the support plate 2 is bonded. The support plate 2 supports the wafer 1 so as to prevent the wafer 1 from cracking and warping, during a thinning process, transfer, and the like of the wafer 1 in production. In the substrate processing apparatus 100, the wafer 1 is processed by performing processing on the laminate 3 in which the wafer 1 and the support plate 2 are bonded to each other. After the processing, the wafer 1 is separated from the support plate 2.

(Cooling Unit 30)

The cooling unit 30 includes a cooling area (holding jig) 31, a cooling plate 32, and a pre-aligner 33. In the cooling unit 30, the wafer 1 or the support plate 2 is cooled on the cooling plate 32, by a method such as water-cooling by use of a chiller. The pre-aligner 33 aligns center positions of the wafer 1 and the support plate 2. After the laminate 3 is formed by bonding the wafer 1 and the support plate 2 to each other, the laminate 3 is held and naturally cooled in the cooling area 31. The cooling area 31 will be detailed later.

Note that the cooling unit 30 may include a plurality of unit sets each of which includes a cooling area 31 and a cooling plate 32. This makes it possible to simultaneously cool a plurality of wafers 1, a plurality of support plates 2, or a plurality of laminates 3.

(Applying Unit 40)

The applying unit 40 includes a transfer robot 41, an applying cup unit 43, a washing cup unit 44, and a baking plate 42. The transfer robot 41 transfers a wafer 1 or a support plate 2 to the applying cup unit 43. In the applying cup unit 43, an adhesive is applied to one surface of the wafer 1 or the support plate 2. In a case where the adhesive is accidentally adhered to the other surface of the wafer 1 or the support plate 2, the wafer 1 or the support plate 2 having the other surface to which the adhesive is adhered is transferred to the washing cup unit 44. In the washing cup unit 44, the other surface to which the adhesive is adhered is washed so that the adhesive is removed. After the adhesive is applied to the one surface of the wafer 1 or the support plate 2, the wafer 1 or the support plate 2 is transferred onto the baking plate 42 by the transfer robot 41, and baked on the baking plate 42. Thereafter, the wafer 1 and the support plate 2 are transferred to a load lock chamber 21 (later described) of the transfer unit 20. In the load lock chamber 21, the wafer 1 and the support plate 2 are superposed. Then, a laminated body including the wafer 1 and the support plate 2 is transferred to the bonding unit 10. The laminated body here will subsequently be the laminate 3.

(Bonding Unit 10)

The bonding unit 10 includes (i) a pair of bonding plates between which the wafer 1 and the support plate 2 to be bonded to each other are placed for forming the laminate 3, and (ii) lift pins for taking out the laminate 3. The laminate 3 is formed by heating and bonding the wafer 1 and the support plate 2 under pressure by use of the pair of bonding plates in the bonding unit 10, and then taken out by the lift pins.

Note here that the wafer 1 has, for example, a surface on which a circuit pattern is formed, and this surface may be bonded to the support plate 2. The laminate 3 taken out by the lift pins is transferred to the transfer unit 20. The wafer 1 may be a conventionally well-known substrate. Examples of a material for the wafer 1 encompass quartz, silicon, sapphire, and GaAs (gallium arsenide).

It is preferable that the support plate 2 be a flexible plate which can support the wafer 1. The support plate 2 may be a conventionally well-known plate. Examples of a material for such a conventionally well-known plate encompass glass, silicon, alumina, silicon carbide, resin, and metals such as aluminum, stainless steel, and an alloy of iron and nickel. A through hole may be formed in the support plate 2. The support plate 2 having such a through hole can be efficiently separated from the wafer 1, by supplying a solvent to an adhesive between the wafer 1 and the support plate 2 through the through hole.

Examples of the adhesive for adhering the wafer 1 to the support plate 2 encompass (i) an adhesive composition containing an acrylic resin material, a maleimide resin material, a hydrocarbon resin (such as cycloolefin resin, terpene resin, or petroleum resin) material, or a novolac phenol resin material, and (ii) an adhesive soluble in an organic solvent. These adhesives may be used singly or in combination.

The laminated body transferred to the bonding unit 10 is heated and bonded under pressure in the bonding unit 10. Pressure is reduced inside the bonding unit 10, for suitably bonding the wafer 1 and the support plate 2 under pressure with the use of the adhesive. Further, in the bonding unit 10, the laminated body is heated to a suitable temperature that depends on a type of the adhesive. The temperature at which the laminated body is heated in the bonding unit 10 is not particularly limited, but preferably in a range of 150° C. to 250° C.

The laminate 3 is formed by heating and bonding under pressure in a reduced pressure environment in the bonding unit 10, and then thus formed laminate 3 is taken out from the bonding unit 10 by use of the lift pins. Thereafter, the laminate 3 is transferred into the load lock chamber 21 of the transfer unit 20. The lift pins support at respective points in an inner periphery of a first surface of the wafer 1 and lift up the laminate 3. This first surface is opposite to a second surface onto which the support plate 2 is bonded. Thereby, the laminate 3 is separated from the pair of bonding plates.

(Transfer Unit 20)

The transfer unit 20 includes the load lock chamber 21, a transfer robot (support jig) 22, and a cassette station 23. The laminate 3 taken out from the bonding unit 10 is transferred to the load lock chamber 21. Pressure is reduced in the load lock chamber 21. In the load lock chamber 21, the laminate 3 is transferred onto the cassette station 23 by the transfer robot 22, while being supported by support pins 12, as shown in FIG. 2, that are provided to the transfer robot 22. Specifically, the support pins 12 support the laminate 3 respectively at points in an inner periphery of the first surface of the wafer 1. This first surface is opposite to the second surface onto which the support plate 2 is bonded.

The laminate 3 is at a high temperature immediately after being taken out from the bonding unit 10. The temperature of the laminate 3 gradually decreases while the laminate 3 is being transferred in the load lock chamber 21 of the transfer unit 20. Conventionally, when the temperature decreases, the laminate 3 warps, in other words, the wafer 1 warps. In the load lock chamber 21 of the substrate processing apparatus 100, however, the laminate 3 is transferred while being supported by the support pins 12 that support respectively at the points in the inner periphery of the first surface of the wafer 1. This makes it possible to prevent the center of the wafer 1 from sagging, that is, to prevent the wafer 1 from warping.

Figure 3:
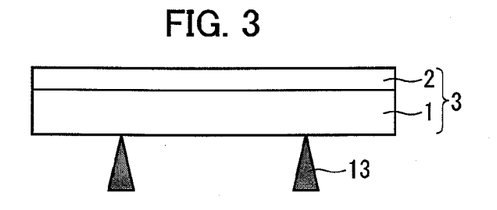
FIG. 3 is a cross-sectional view schematically showing an example of positions at which a laminate is supported in a substrate processing apparatus in accordance with an embodiment of the present invention.
Figure 4:
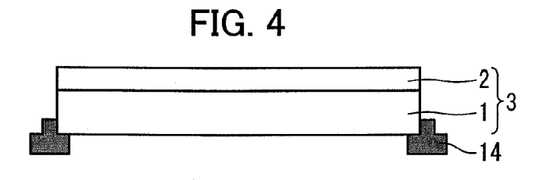
FIG. 4 is a cross-sectional view schematically showing an example of positions at which a laminate is supported in a substrate processing apparatus in accordance with an embodiment of the present invention.
Figure 5:
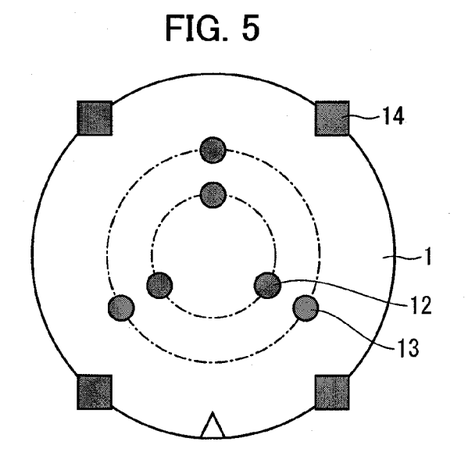
FIG. 5 is a top view schematically showing an example of positions at which a laminate is supported in a substrate processing apparatus in accordance with an embodiment of the present invention.

The following describes how the support pins 12 support the laminate 3, with reference to FIGS. 3 to 5. FIGS. 3 and 4 each are a cross-sectional view schematically showing an example of positions at which the laminate 3 is supported in the support processing apparatus 100. FIG. 5 is a top view schematically showing an example of positions at which the laminate 3 is supported in the support processing apparatus 100. As shown in FIG. 2, the support pins 12 support the laminate 3 respectively at the points in the inner periphery of the first surface of the wafer 1. These points supported by the support pins 12 are provided at respective positions closer to the center of the wafer 1 in the inner periphery. Additionally, as shown in FIG. 3, support pins 13 may be provided so as to support the laminate 3 respectively at points in the inner periphery of the first surface of the wafer 1. These points supported by the support pins 13 are provided at respective positions farther from the center of the wafer 1 than the support pins 12 in the inner periphery. As such, the points supported by the support pins 12 and 13 are provided in the inner periphery of the first surface of the wafer 1 so that the laminate 3 is supported at such points in the inner periphery of the first surface of the wafer 1. This makes it possible to prevent warping of the wafer 1, which warping differently occurs depending on, for example, types of glass from which the support plate 2 is made.

Note that support pins 14 as shown in FIG. 4 may be provided so as to support the laminate 3 respectively at positions corresponding to points in an outer periphery of the wafer 1. Note also that the laminate 3 may be supported by the support pins 14 before or at the start of transfer of the wafer 1 in the load lock chamber 21, as long as the laminate 3 is supported by the support pins 12 or 13 respectively at the points in the inner periphery of the first surface of the wafer 1 during transfer of the laminate 3 in the load lock chamber 21.

That is, positions of the support pins can be selected as appropriate, as long as the laminate 3 is supported respectively at the points in the inner periphery of the first surface of the wafer 1 while being transferred in the load lock chamber 21. The positions can be selected from among, for example, positions of the support pins 12, the support pins 13, and the support pins 14 as shown in FIG. 5. Therefore, the support pins may be configured to be movable in a planar direction of the first surface of the wafer 1. Such a configuration makes it possible to appropriately select positions of the support pins in accordance with, for example, a direction in which the wafer 1 warps or how easily the wafer 1 warps.

It is preferable that the transfer robot 22 is provided with at least three support pins so that the laminate 3 is supported at not less than three points in the inner periphery of the first surface of the wafer 1 as shown in FIG. 5. Further, it is preferable that, as shown in FIG. 5, the not less than three points be provided at equal intervals on a circumference of a circle that has a center in common with the first surface of the wafer 1 having a substantially circular shape. This makes it possible to more stably support the laminate 3.

Further, it is preferable that the circle have a diameter that is 0.1 to 0.8 times a diameter of the first surface of the wafer 1 in a case where the support pins are disposed on the circumference of the circle that has the center in common with the first surface of the wafer 1. This makes it possible to more reliably prevent warping of the laminate 3, that is, warping of the wafer 1 during transfer of the laminate 3 in the load lock chamber 21. It is possible to more effectively prevent the wafer 1 from warping when the circle where the support pins are disposed has a smaller diameter.

A shape of the support pins is not particularly limited. Each of the support pins may have (i) a cylindrical body for stably supporting the laminate 3, and (ii) a round head for not damaging the first surface of the wafer 1.

The laminate 3 supported by the support pins is transferred in the load lock chamber 21 under reduced pressure, and then taken out from the load lock chamber 21. Thereafter, the laminate 3 is transferred to the cooling unit 30 under atmospheric pressure, while an outer periphery of the laminate 3 is being supported.

The laminate 3 transferred from the load lock chamber 21 to the cooling unit 30 is kept under atmospheric pressure in the cooling area 31 of the cooling unit 30 and naturally cooled. The cooling area 31 is provided with support pins, like the transfer robot 22. The support pins in the cooling area 31 hold the laminate 3 respectively at points in the inner periphery of the first surface of the wafer 1. The laminate 3 is left under atmospheric pressure in the cooling area 31. As a result, the laminate 3 is cooled. Thereby, a temperature of the laminate 3 is further decreased.

The support pins in the cooling area 31 are configured to support the laminate 3 respectively at the points in the inner periphery of the first surface of the wafer 1 of the laminate 3, in the same manner as the support pins 12 and 13 of the transfer robot 22. Therefore, the support pins of the cooling area 31 may also be configured to be movable in the planar direction of the first surface of the wafer 1. This makes it possible to prevent the laminate 3 from warping while the laminate 3 is being cooled in the cooling area 31. Consequently, it is possible to prevent the wafer 1 from warping.

(Substrate Processing Method)

A substrate processing method of the present invention including the steps of: supporting a wafer to which a support is bonded, by supporting an inner periphery of a first surface of the wafer, the first surface being opposite to a second surface of the wafer onto which second surface the support is bonded; and transferring the wafer thus supported under reduced pressure. That is, the substrate processing apparatus 100 is an embodiment of a substrate processing apparatus that is employed in the substrate processing method of the present invention. Accordingly, the above explanations of the embodiment of the substrate processing apparatus and FIG. 1 apply to an embodiment of the substrate processing method of the present invention.

The present invention is not limited to the description of the embodiments above, and can therefore be variously modified by a skilled person in the art within the scope of the claims. Namely, an embodiment derived from a proper combination of technical means disclosed in different embodiments is encompassed in the technical scope of the present invention.

The following further details an embodiment of the present invention by providing Example. Certainly the present invention is not limited to the Example below, and details can be variously changed.

EXAMPLE (1. Effects Of Materials of Support Plate on Warping)

How a material of a support plate affects warping of a wafer was studied by use of the substrate processing apparatus. In the present example, the following three kinds of glass wafers each having a different thermal expansion coefficient were employed as support plates: (a) a glass wafer made from a material A (thermal expansion coefficient: $3.3 \times (10^{-6} \text{ K}^{-1})$); (b) a glass wafer made from a material B (thermal expansion coefficient: $3.3 \times (10^{-6} \text{ K}^{-1})$); and (c) a glass wafer made from a material C (thermal expansion coefficient: $3.2 \times (10^{-6} \text{ K}^{-1})$). These glass wafers each had a diameter of 300 mm and a thickness of 0.67 mm. Each of these glass wafers as the support plates was bonded to a wafer, and used in this experiment.

Each of the glass wafers as the support plate was bonded to a wafer by heating at 215° C. after a hydrocarbon-based adhesive was applied so that a thickness of the hydrocarbon-based adhesive became 0.05 mm. Thereby, each laminate was formed.

Figure 6:
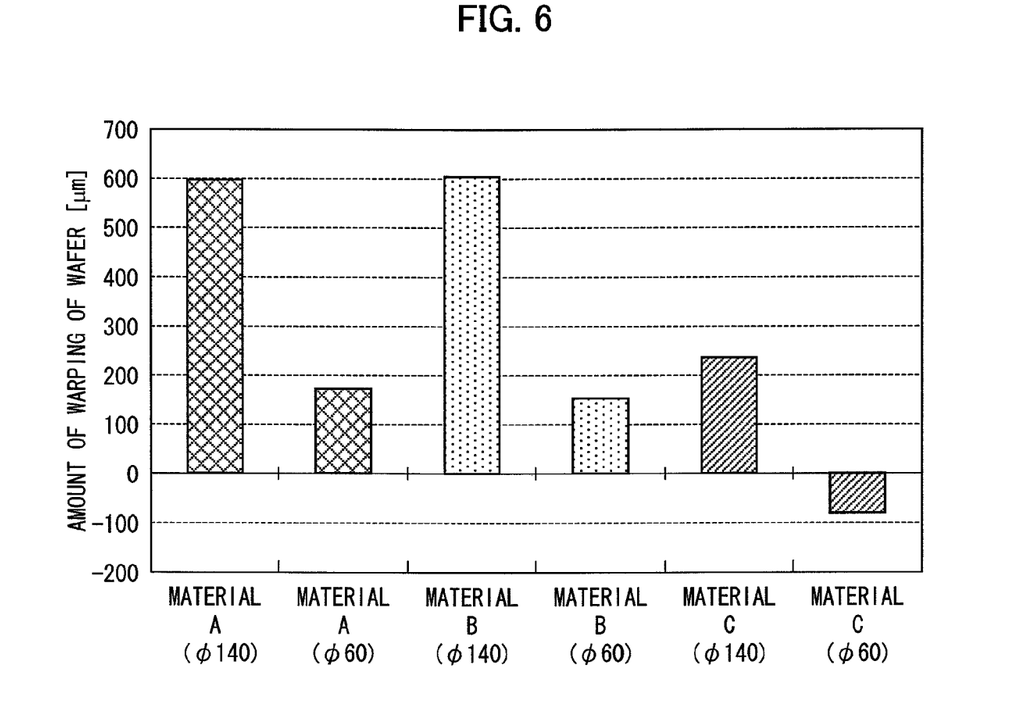
FIG. 6 is a graph showing how (i) a material of a support plate and (ii) supporting positions of support pins affect an amount of warping of a wafer.

Thus formed each laminate of the glass wafer and the wafer was transferred to a load lock chamber, and an amount of warping of the wafer was measured. Here, the support pins were disposed on concentric circles whose diameters were respectively 140 mm and 60 mm. Further, the load lock chamber here was set at a pressure of 2 Pa, and the wafer was transferred at approximately 10 seconds in the load lock chamber. The amount of warping of the wafer was measured by use of a laser displacement meter. FIG. 6 shows a result of this measurement.

FIG. 6 is a graph showing how (i) the material of the support plate and (ii) supporting positions affect an amount of warping of the wafer. As is clear from FIG. 6, in a case where any of the above glass wafers (support plates) was employed, the amount of warping of each wafer was smaller in a case of the support pins provided on a circle whose diameter was 60 mm as compared to a case of the support pins provided on a circle whose diameter was 140 mm. In other words, it was found that the amount of warping of the wafer was reduced when the circle on which the support pins were disposed had a smaller diameter.

(2. How Supporting Positions of Support Pins During Transfer and Cooling of Wafer Affect Amount of Warping of Wafer)

Study was carried out by use of the substrate processing apparatus, on how warping of a wafer was affected by supporting positions of the wafer (i) during transfer of the wafer under reduced pressure and (ii) during cooling of the wafer under atmospheric pressure. In this study, laminates employed were formed in the same manner as the above section (1).

Figure 7:
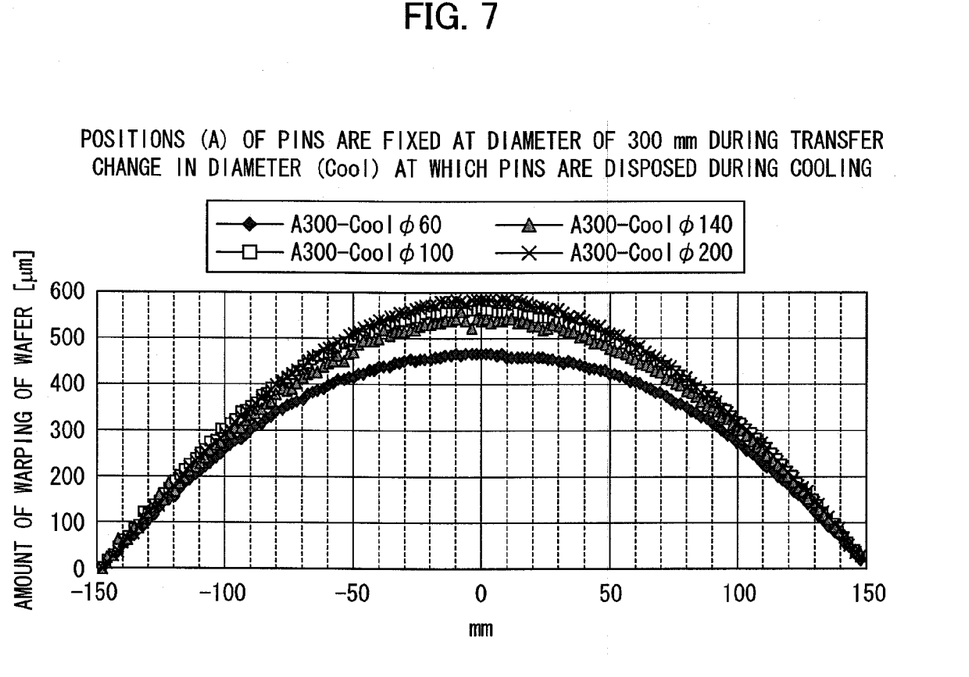
FIG. 7 is a graph showing how supporting positions of support pins during transfer of a wafer affect an amount of warping of the wafer.
Figure 8:
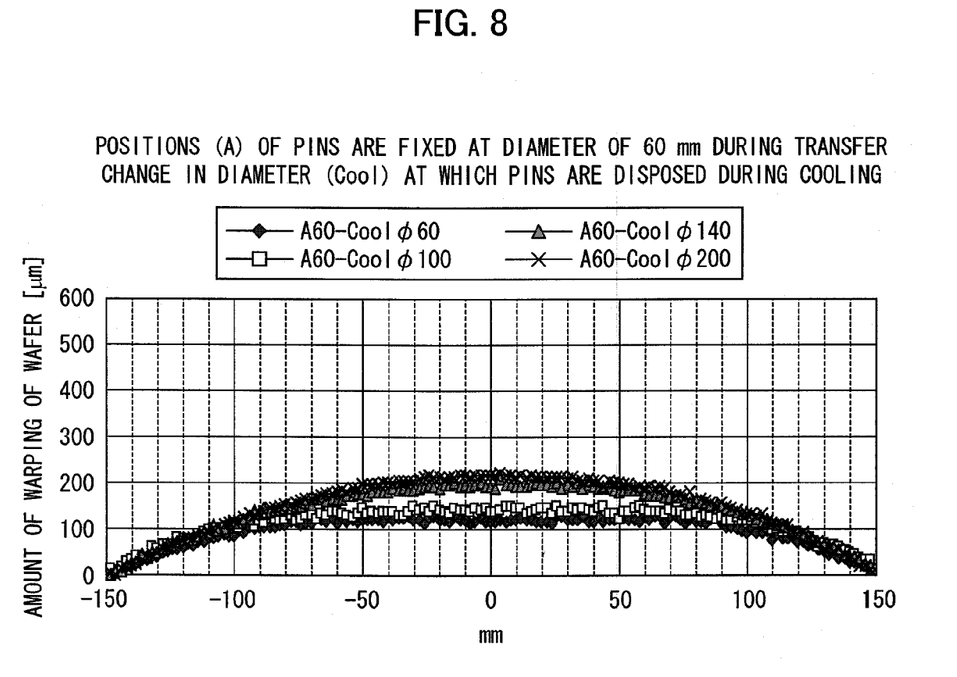
FIG. 8 is a graph showing how supporting positions of support pins during transfer of a wafer affect an amount of warping of the wafer.
Figure 9:
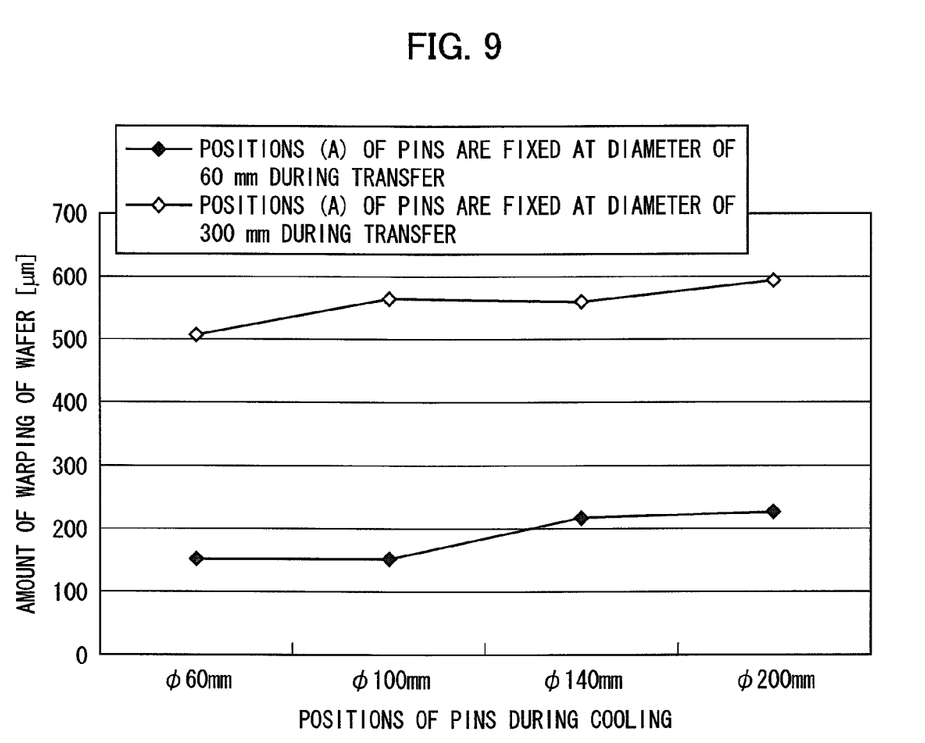
FIG. 9 is a graph showing how supporting positions of support pins during cooling of a wafer affects an amount of warping of the wafer.

Each of the laminates was transferred under conditions that were identical to those of the above section (1) in the present example. Meanwhile, diameters of the concentric circles on which the support pins were provided were respectively 300 mm and 60 mm. Then, an amount of warping of the wafer was measured. Thereafter, each wafer was left in a cooling area and naturally cooled. In this cooling, diameters of concentric circles on which the support pins were disposed were arranged to be respectively 60 mm, 100 mm, 140 mm, and 200 mm. After the wafer was cooled, an amount of warping of the wafer was measured by a laser displacement meter. FIGS. 7 to 9 show results of the measurements.

FIG. 7 is a graph showing an amount of warping of each wafer in a case where (i) each laminate was transferred in the load lock chamber while being supported by the support pins disposed on the circle having the diameter of 300 mm, and then (ii) the each laminate was kept while being supported by the support pins disposed on one of the concentric circles whose diameters were respectively 60 mm, 100 mm, 140 mm, and 200 mm above. FIG. 8 is a graph showing an amount of warping of each wafer in a case where (a) each laminate was transferred in the load lock chamber while being supported by the support pins disposed on the circle having the diameter of 60 mm, and then (b) the each laminate was kept while being supported by the support pins disposed on one of the concentric circles whose diameters were respectively 60 mm, 100 mm, 140 mm, and 200 mm above. As is clear from FIGS. 7 and 8, it was found that the amount of warping of the wafer was smaller regardless of positions of the support pins during cooling of the wafer, in a case where the diameter of the circle on which the support pins were disposed was smaller, that is, 60 mm during transfer of the laminate, as compared to a case where the diameter of such a circle was 300 mm. That is, it was found that the amount of warping of the wafer was smaller when the circle on which the support pins were disposed had a smaller diameter.

FIG. 9 is a graph showing the results of the experiments shown in FIGS. 7 and 8, for comparing respective cases in which the support pins provided in different positions were employed in the cooling area. FIG. 9 compares respective amounts of warping of wafers in (i) a case where the diameter of the circle on which the support pins were disposed was 60 mm in the load lock chamber, and the diameters of the concentric circles on which the support pins were disposed were respectively 60 mm, 100 mm, 140 mm, and 200 mm in the cooling area and (ii) a case where the diameter of the circle on which the support pins were disposed was 300 mm in the load lock chamber, and the diameters of the concentric circles on which the support pins were disposed were respectively 60 mm, 100 mm, 140 mm, and 200 mm in the cooling area. As is clear from FIG. 9, it was found that an amount of warping of a wafer was smaller when the circle on which the support pins were disposed had a smaller diameter in the cooling area. Further, it was also found that positions of the support pins in the load lock chamber more remarkably affect an amount of warping of a wafer.

INDUSTRIAL APPLICABILITY

The present invention is applicable in production of semiconductor chips to be mounted on mobile phones, digital AV equipment, IC cards, etc.

REFERENCE SIGNS LIST

1: wafer
2: support plate (support)
3: laminate
10: bonding unit
12: support pin
13: support pin
14: support pin
20: transfer unit
21: load lock chamber
22: transfer robot (support jig)
23: cassette station
30: cooling unit
31: cooling area (holding jig)
32: cooling plate
33: pre-aligner
40: applying unit
41: transfer robot 42: baking plate
43: applying cup unit
44: washing cup unit
100: substrate processing apparatus

What is claimed is:

1. A system comprising a substrate processing and a substrate, said system comprising:
a substrate to which a support is bonded; support sections for supporting the substrate to which the support is bonded, wherein the support is made of glass, the support sections supporting an inner periphery of a first surface of the substrate, wherein the first surface of the substrate is opposite to a second surface of the substrate onto which the support is bonded,
wherein the support sections support the substrate at not less than three points in the inner periphery of the first surface of the substrate,
the not less than three points are disposed at equal intervals on a circumference of a circle having a center in common with the first surface having a substantially circular shape, and
the circle has a diameter that is $1/10$ to $1/3$ times a diameter of the first surface; and
a transfer robot for taking out the substrate supported by the support sections in a load lock chamber under reduced pressure and transferring the substrate under atmospheric pressure while an outer periphery of the substrate is being supported.

2. The system of claim 1, wherein the support sections are movable in a planar direction of the first surface.

3. The system of claim 1, further comprising a holding jig including support pins, wherein the support pins support the substrate transferred by the transfer robot under atmospheric pressure, wherein the support pins support the inner periphery of the first surface of the substrate.

4. A substrate processing method comprising:
supporting, in a load lock chamber under reduced pressure, a substrate to which a support is bonded, wherein the support is made of glass, using support sections supporting an inner periphery of a first surface of the substrate, wherein the first surface is opposite to a second surface of the substrate onto which a second surface of the support is bonded,
wherein the support sections support the substrate at not less than three points in the inner periphery of the first surface of the substrate,
the not less than three points are disposed at equal intervals on a circumference of a circle having a center in common with the first surface having a substantially circular shape, and
the circle has a diameter that is $1/10$ to $1/3$ times a diameter of the first surface; and
taking out the substrate supported by the support sections and transferring the substrate under atmospheric pressure, while an outer periphery of the substrate is being supported.

5. The substrate processing method of claim 4, further comprising, after the substrate is transferred, supporting the substrate under atmospheric pressure using support pins supporting the inner periphery of the first surface of the substrate.

* * * * *